United States Patent
Ufert et al.

(10) Patent No.: US 7,442,605 B2
(45) Date of Patent: Oct. 28, 2008

(54) RESISTIVELY SWITCHING MEMORY

(75) Inventors: Klaus Dieter Ufert, Unterschleißheim (DE); Cay-Uwe Pinnow, München (DE)

(73) Assignee: Infineon Technologies AG, Munich (DE)

( * ) Notice: Subject to any disclaimer, the term of this patent is extended or adjusted under 35 U.S.C. 154(b) by 14 days.

(21) Appl. No.: 11/113,332

(22) Filed: Apr. 25, 2005

(65) Prior Publication Data

US 2005/0250281 A1    Nov. 10, 2005

(30) Foreign Application Priority Data

Apr. 26, 2004   (DE) .................. 10 2004 020 297

(51) Int. Cl.
*H01L 21/82* (2006.01)
(52) U.S. Cl. .................. 438/257; 438/130; 438/382; 257/154
(58) Field of Classification Search ................ 438/130, 438/257, 382; 257/154
See application file for complete search history.

(56) References Cited

U.S. PATENT DOCUMENTS

| | | | |
|---|---|---|---|
| 6,635,914 B2 | 10/2003 | Kozicki et al. | |
| 6,709,958 B2 * | 3/2004 | Li et al. | 438/513 |
| 6,813,176 B2 * | 11/2004 | Gilton et al. | 365/100 |
| 6,818,481 B2 * | 11/2004 | Moore et al. | 438/130 |
| 7,087,919 B2 * | 8/2006 | Campbell et al. | 257/2 |
| 2003/0052330 A1 * | 3/2003 | Klein | 257/154 |
| 2004/0076051 A1 | 4/2004 | Klein | |

OTHER PUBLICATIONS

M. N. Kozicki et al, (2000) "Nanoscale Effects in Devices Based on Chalcogenide Solid Solutions," Superlattices and Microstructures 27(5/6), pp. 485-488.

* cited by examiner

*Primary Examiner*—Steven Loke
*Assistant Examiner*—David Goodwin
(74) *Attorney, Agent, or Firm*—Dicke, Billig, Czaja PLLC

(57) ABSTRACT

The present invention relates to a reproducible conditioning during the manufacturing of a resistively switching CBRAM memory cell comprising a first electrode and a second electrode with an active material positioned therebetween. The active material is adapted to be placed in a more or less electroconductive state by means of electrochemical switching processes. A CBRAM memory cell manufactured pursuant to the method according to the invention has, due to the improved conditioning, more reliable and more distinctly evaluable electrical switching properties. Moreover, no more forming step is necessary with the method according to the present invention.

22 Claims, 2 Drawing Sheets

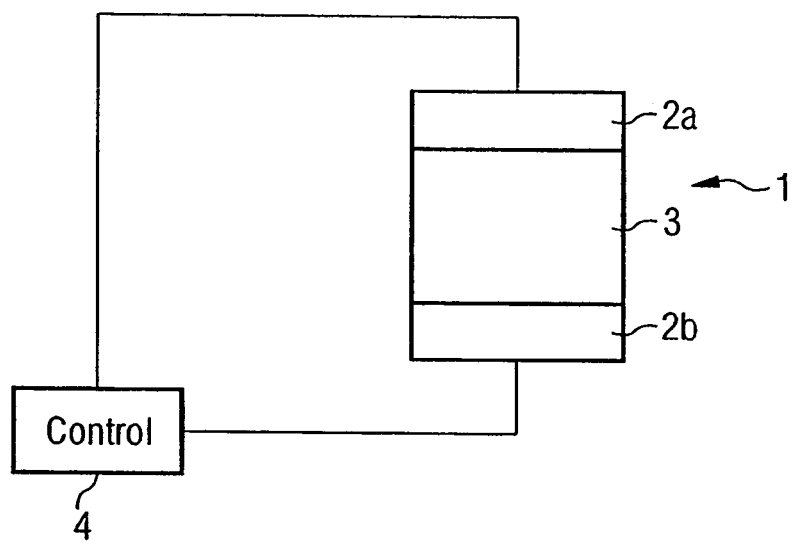
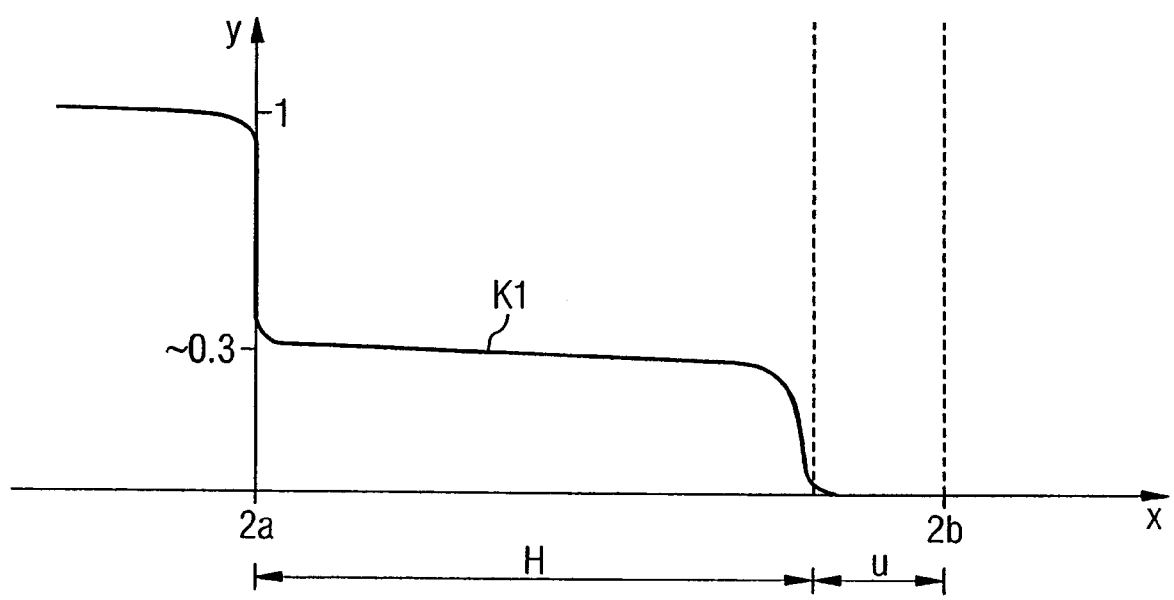

RESISTIVELY SWITCHING MEMORY

CLAIM FOR PRIORITY

This application claims priority to German Application No. 10 2004 020 297.4 filed Apr. 26, 2004, which is incorporated herein, in its entirety, by reference.

TECHNICAL FIELD OF THE INVENTION

The invention relates to a method for manufacturing a resistively switching memory cell, and to a memory device, in particular a resistively switching memory device, and a system including such a memory device.

BACKGROUND OF THE INVENTION

In the case of conventional memory devices, in particular conventional semiconductor memory devices, one differentiates between so-called functional memory devices (e.g. PLAs, PALs, etc.) and so-called table memory devices, e.g. ROM devices (ROM=Read Only Memory)—in particular PROMs, EPROMs, EEPROMs, flash memories, etc.—, and RAM devices (RAM=Random Access Memory or read-write memory), e.g. DRAMs (Dynamic Random Access Memory or dynamic read-write-memory) and SRAMs (Static Random Access Memory or static read-write-memory).

A RAM device is a memory for storing data under a predetermined address and for reading out the data under this address later. Since it is intended to accommodate as many memory cells as possible in a RAM device, one has been trying to realize same as simple as possible and to scale them as small as possible.

In the case of SRAMs, the individual memory cells consist e.g. of few, for instance 6, transistors, and in the case of so-called DRAMs in general only of one single, correspondingly controlled capacitive element, e.g. a trench capacitor with the capacitance of which one bit each can be stored as charge. This charge, however, remains for a short time only. Therefore, a so-called "refresh" must be performed regularly, e.g. approximately every 64 ms.

In contrast to that, no "refresh" has to be performed in the case of SRAMS since the data stored in the memory cell remain stored as long as an appropriate supply voltage is fed to the SRAM.

In the case of non-volatile memory devices (NVMs), e.g. EPROMs, EEPROMs, and flash memories, the stored data remain, however, stored even when the supply voltage is switched off.

Furthermore, so-called resistive or resistively switching memory devices have also become known recently, e.g. so-called Phase Change Memories and PMC memories (PMC=Programmable Metallization Cell), which are also referred to as CBRAM memories (CB=Conductive Bridging).

In the case of resistive or resistively switching memory devices, an "active" material—which is, for instance, positioned between two appropriate electrodes (i.e. an anode and a cathode)—is placed, by appropriate switching processes, i.e. by appropriate current or voltage pulses of particular intensity and duration, in a more or less conductive state. The more conductive state corresponds e.g. to a stored, logic "One", and the less conductive state to a stored, logic "Zero", or vice versa.

In the case of Phase Change Memories (PC memories), for instance, a chalcogenide compound may be used as an active material that is positioned between two electrodes. Chalcogenide compounds are e.g. a Ge—Sb—Te or an Ag—In—Sb—Te compound. The chalcogenide compound material has the property to be adapted to be placed in an amorphous, relatively weakly conductive, or a crystalline, relatively strongly conductive state by appropriate switching processes. The relatively strongly conductive state may, for instance, correspond to a stored, logic "One", and the relatively weakly conductive state may correspond to a stored, logic "Zero", or vice versa.

Phase Change Memory Cells are, for instance, known from G. Wicker, Nonvolatile, High Density, High Performance Phase Change Memory, SPIE Conference on Electronics and Structures for MEMS, Vol. 3891, Queensland, 2, 1999, and e.g. from Y. N. Hwang et al., Completely CMOS Compatible Phase Change Non-volatile RAM Using NMOS Cell Transistors, IEEE Proceedings of the Nonvolatile Semiconductor Memory Workshop, Monterey, 91, 2003, S. Lai et al., OUM-a 180 nm nonvolatile memory cell element technology for stand alone and embedded applications, IEDM 2001, etc.

In the case of PMC memories (PMC=Programmable Metallization Cell)—depending on whether a logic "One" or a logic "Zero" is to be written into the cell—conductive bridges (e.g. of Ag or Cu, etc.) are built up during the programming of a corresponding PMC memory cell by means of current or voltage pulses of particular duration and intensity, and by electrochemical reactions caused thereby, in an active material positioned between two electrodes, which results in a conductive state of the cell, or are broken down again, which results in a non-conductive state of the cell.

PMC memory cells or CBRAM memory cells, respectively, are e.g. known from Y. Hirose, H. Hirose, J. Appl. Phys. 47, 2767 (1975), and e.g. from M. N. Kozicki, M. Yun, L. Hilt, A. Singh, Electrochemical Society Proc., Vol. 99-13, (1999) 298, M. N. Kozicki, M. Yun, S. J. Yang, J. P. Aberouette, J. P. Bird, Superlattices and Microstructures, Vol. 27, No. 5/6 (2000) 485-488, and e.g. from M. N. Kozicki, M. Mitkova, J. Zhu, M. Park, C. Gopalan, "Can Solid State Electrochemistry Eliminate the Memory Scaling Quandry", Proc. VLSI (2002) and R. Neale: "Micron to look again at non-volatile amorphous memory", Electronic Engineering Design (2002).

CBRAM memories are, for instance, described in Y. Hirose, H. Hirose, J. Appl. Phys. 47, 2767 (1975), T. Kawaguchi et al., "Optical, electrical and structural properties of amorphous Ag—Ge—S and Ag—Ge—Se films and comparison of photo-induced and thermally induced phenomena of both systems", J. Appl. Phys. 79 (12), 9096, 1996, and e.g. in M. Kawasaki et al., "Ionic conductivity of Agx(GeSe3)1−x (0<x0.571) glasses", Solid State Ionics 123, 259, 1999, etc.

In the case of CBRAM memory cells, an electro-chemically active material is positioned in a volume between two electrodes, for instance, an appropriate chalcogenide material e.g. in a GeSe, GeS, AgSe, or CuS compound. In the case of the CBRAM memory cell, the above-mentioned switching process is based on the fact that, by applying appropriate current or voltage pulses of particular intensity and duration to the electrodes, elements of a so-called deposition cluster increase in volume in the active material positioned between the electrodes until the two electrodes are finally bridged electroconductively, i.e. are electroconductively connected with each other, which corresponds to the electroconductive state of the CBRAM cell.

By applying correspondingly inverse current or voltage pulses, this process can be reversed again, and the corresponding CBRAM cell can be placed in a non-conductive state again. This way, a "switching" between a state with a higher electroconductivity of the CBRAM memory cell and a state with a lower electroconductivity of the CBRAM memory cell can be achieved.

The switching process in the CBRAM memory cell is substantially based on the modulation of the chemical composition and the local nanostructure of a chalcogenide material doped with a metal, serving as solid body electrolyte and diffusion matrix. The pure chalcogenide material typically has a semiconductor behavior and has a very high electric resistance at room temperature, the resistance being by magnitudes, i.e. decimal powers of the ohmic resistance value, higher than that of an electroconductive material. By the current or voltage pulses applied via the electrodes, the steric arrangement and the local concentration of the ionically and metallically available components of the element mobile in the diffusion matrix is changed. By that, the so-called bridging, i.e. an electric bridging of the volume between the electrodes of metal-rich depositions, can be caused, which changes the electric resistance of the CBRAM cell by several magnitudes by the ohmic resistance value being decreased by several decimal powers.

One difficulty with this switching process in a CBRAM memory cell consists in that the electric resistance between the electrodes may vary relatively strongly with a particular state of the cell ("conductive" or "non-conductive"). This variation aggravates the evaluation or the differentiation, respectively, between the conductive and the non-conductive state by a corresponding evaluation circuit. This means that it is aggravated to determine whether a logic "Zero" or a logic "One" was last stored in the corresponding memory cell. A further difficulty consists in that the CBRAM memory cell does not comprise any reproducible switching properties in the "unconditioned" state. It is therefore necessary to condition the memory cell, i.e. to be able to exactly control the doping of the memory cell, to achieve a reproducible switching behavior.

The CBRAM memory cell therefore has to be conditioned prior to the above-described switching behavior. This means that the doping of the chalcogenide matrix positioned between the electrodes has to be adjusted reproducibly by a mobile, metallic element so as to achieve a good control of the overall concentration or a good controllability of the metal element, respectively, and thus a good control of the electric resistance in the CBRAM memory cell.

The conditioning of a CBRAM memory cell has so far been performed e.g. by means of photo diffusion, i.e. a probe that may, for instance, be generated by a metal layer on a chalcogenide material is exposed with light in the ultraviolet frequency range, this causing the metal to be driven into the probe. In literature, this method is also referred to as photo diffusion and results in a particular metallic doping profile of the chalcogenide material in which metal-rich depositions form in the chalcogenide matrix. This way, a doped and an undoped phase will be generated in the chalcogenide layer.

Other methods by means of which a conditioning of the probe is achieved are, for instance, thermal methods where a regular diffusion occurs, or implantation methods. These methods may also be combined to obtain a doping of the chalcogenide matrix.

A drawback of the thermal method consists in that the amorphicity of the probe may be lost since a nanocrystallization with subsequent grain growth occurs which substantially changes the nanostructure or microstructure, respectively, of the probe. The ion movability of the metal doping substance is, however, as a rule by magnitudes smaller in crystalline materials, which may involve a significant degradation of the memory cell properties.

A drawback of the photo diffusion process consists i.a. in that the doping profile is very steep due to the photo-stimulated doping process since the movability of the ions is distinctly higher in the metal-rich phase. This results in an extremely critical process control since, as soon as the steep doping edge of the photo diffusion profile at the limiting area has reached the opposite electrode, the memory cell is irreversibly electrically short-circuited. If, however, the photo diffusion profile does not expand far enough through the chalcogenide matrix, an electric forming pulse is additionally required which drives the metallic material thermally into the chalcogenide material by means of local heating. The electric forming pulse is, however, incompatible with some semiconductor manufacturing processes of mass products since an electrical conditioning does not guarantee sufficient reproducibility.

A drawback of the implantation process consists in that extremely high doses of metal have to be implanted, which requires a very high implantation performance and/or a very long duration of the implantation process. A further difficulty results from the fact that the implanted doping courses are formed very flatly since otherwise an undesired mixing or, in the case of too deep implantation profile courses, an electric short-circuit will be caused.

SUMMARY OF THE INVENTION

The present invention provides a method that enables a reproducible conditioning during the manufacturing of a CBRAM memory cell, and a system with such a memory device. The present invention includes, in particular, providing a method by which it is possible to control the diffusion of the ions in the chalcogenide material of the CBRAM memory cell and to thus optimize the concentration profile between the doped and the undoped phase of the chalcogenide matrix.

In accordance with one embodiment of the invention, there is provided a method for manufacturing a memory cell, in particular a resistively switching memory cell, comprising a first electrode and a second electrode with an active material positioned therebetween, the active material being adapted to be placed in a more or less electroconductive state by means of electrochemical switching processes, wherein the method comprises:

(a) doping the active material in a doping process by diffusing a mobile material into the active material from the first electrode in the direction of the second electrode, (b) optimizing the doping of the active material in a retraction process by at least partial retraction of the mobile material diffused into the active material from a region close to the second electrode.

This way, the mobile material is, in the first part of the method, the doping process (a), diffused from the first electrode into the active material, wherein the doping process may be performed until the mobile material has completely diffused through the active material and has reached the second electrode. In the second part of the method, the retraction process (b), the mobile material is diffused back at least partially in the direction from the second electrode to the first electrode, so that the region close to the second electrode assumes an undoped state again. By that, the region close to the second electrode, and thus the memory cell altogether, is conditioned, i.e. the doping of the memory cell can be controlled exactly, which constitutes a prerequisite of a reproducible switching behavior of the memory cell.

The active material preferably consists of a chalcogenide compound, in particular a GeSe, GeS, AgSe, CuS, Ge—Sb—

Te or an Ag—In—Sb—Te compound, forming a chalcogenide matrix in which the mobile material may move or be diffused into, respectively. The mobile material includes, for example, of alkali ions or metal ions, respectively, in particular of Ag or Cu.

The above-mentioned is consequently addressed by the present invention in that the ions that have been diffused too deeply into the chalcogenide matrix diffuse back again at least partially by means of the ion retraction process according to the invention, so that there is the possibility of controlling and thus optimizing the concentration profile between the doped and the undoped region in the chalcogenide layer. The present invention thus provides a method in which the penetration depth of the metal ions into the chalcogenide material may be reduced again during the so-called front end of line processing.

According to the present invention, there result new possibilities of process control for the manufacturing of CBRAM memory cells. According to a preferred embodiment of the method according to the invention, a temporary overdoping of the chalcogenide matrix is, for instance, possible by means of an overdoping process, and can be reversed again in the further course of the process.

According to another preferred embodiment of the present invention, the above-mentioned doping process (a) is therefore divided into the following partial steps:
(a1) doping the active material by diffusing a mobile material into the active material in a doping process,
(a2) overdoping the active material by diffusing the mobile material into the active material in an overdoping process exceeding method step (a1), so that a doped region from the first electrode to the second electrode is formed in the active material.

The process flow can be substantially simplified in that self-adjusting processes are employed with the method according to the invention. Self-adjusting means in this context that different lithography levels or lithography processes, respectively, do not comprise any misadjustment with respect to one another. Due to the self-adjusting processes, the area of the memory cell can be reduced distinctly, and thus the dimension of the CBRAM memory cell itself can be reduced.

Advantageously, the active material is positioned between two electrodes, and the doping process (a or a1, respectively) and/or the overdoping process (a2) is performed such that the mobile material is diffused into the active material from the one electrode to the other electrode. This way, a doped or overdoped phase, respectively, and an undoped phase is formed in the active material or in the chalcogenide matrix, respectively, wherein a particular penetration depth of the mobile material into the active material or the metal ions, respectively, in particular in a region between the doped or over-doped phase, respectively, and the undoped phase in the active material is obtained.

Furthermore, by means of the method according to the invention, in the active material or in the chalcogenide matrix, respectively there can be formed a particular concentration profile of the mobile material or the metal ions, respectively, in particular in the region between the doped or overdoped phase and the undoped phase in the active material. By means of the method according to the invention it is consequently possible to control, during the manufacturing of CBRAM memory cells, the diffusion of the ions in the chalcogenide material of the CBRAM memory cell, and to thus optimize the concentration profile between the doped and the undoped phases of the chalcogenide matrix.

The present invention substantially utilizes the effect that movable ions such as alkali ions can, in insulating glasses, depending on the polarity, be drawn to the layer surface or be driven deeper into the volume or to the opposite surface, respectively, with a charge applied from outside. By means of this electrical charging, the concentration profile in the chalcogenide layer may be modified, which enables an optimization of the resulting diffusion profile. The chalcogenide layer may, for instance, be preconditioned already by means of photo diffusion. An optimization of the diffusion profile may, in this case, mean an expansion of the limiting area, a homogenization, or even an improvement with respect to the steepness of the profile between the undoped and the doped region in the chalcogenide layer.

According to a further preferred embodiment of the present invention, the mobile material is diffused into or diffused back, respectively, by means of an electric charge of appropriate polarity which is applied on the active material preferably via the electrodes from outside. The charging of the electric charge may, for instance, be performed by inert gas ion beams or by contact with a high-frequency inert gas plasma. The potential of a floating surface, e.g. an Ag/Ge—Se layer, in the plasma is, on average, approximately 10V to 15V vis-à-vis the plasma potential of some eV with the plasma electron temperatures that are presently common in coating processes and etching processes.

The potential is substantially determined by the electron temperature, and this temperature is, in turn, with a fixed plasma excitation frequency, dependent on the gas pressure and on the external high frequency power fed into the plasma. With these two parameters, the potential of the floating surface, the so-called floating potential, and thus also the depth profile of the metal ions, such as Ag, in the chalcogenide layer, such as Ge—Se, may be varied.

Although basically also capacitively coupled high frequency plasmas can, for instance, be used with an excitation frequency of 13.56 MHz, an inductively excited plasma at a frequency of 27 MHz (high dense plasma) is particularly suited, such as it is at present used frequently for etching processes. In this inductively coupled plasma, the substrate with the Ag/Ge—Se-layer can be better arranged geometrically, and electric interactions with the electrode faces, such as they are employed in the capacitively coupled plasmas, can be avoided better.

As a working gas for the plasma discharge, apart from argon (Ar), it is in particular also inert gases with lower masses such as neon (Ne) and helium (He) that are suited since, with these working gases, sputtering effects by hitting ions are negligible.

A CBRAM memory cell manufactured pursuant to the method according to the invention comprises, due to the improved conditioning, more reliable and more distinctly evaluable electric switching properties. Moreover, no more forming step is necessary with the method according to the present invention.

BRIEF DESCRIPTION OF THE DRAWINGS

In the following, the invention will be explained in more detail with reference to several embodiments and the enclosed drawings. In the drawings:

FIG. 1 shows a resistively switching memory cell and a central control means connected thereto.

FIG. 2 shows the metal concentration in the chalcogenide layer during the manufacturing of a CBRAM memory cell after a doping process according to a preferred embodiment of the present invention.

DETAILED DESCRIPTION OF THE INVENTION

Figure 3:
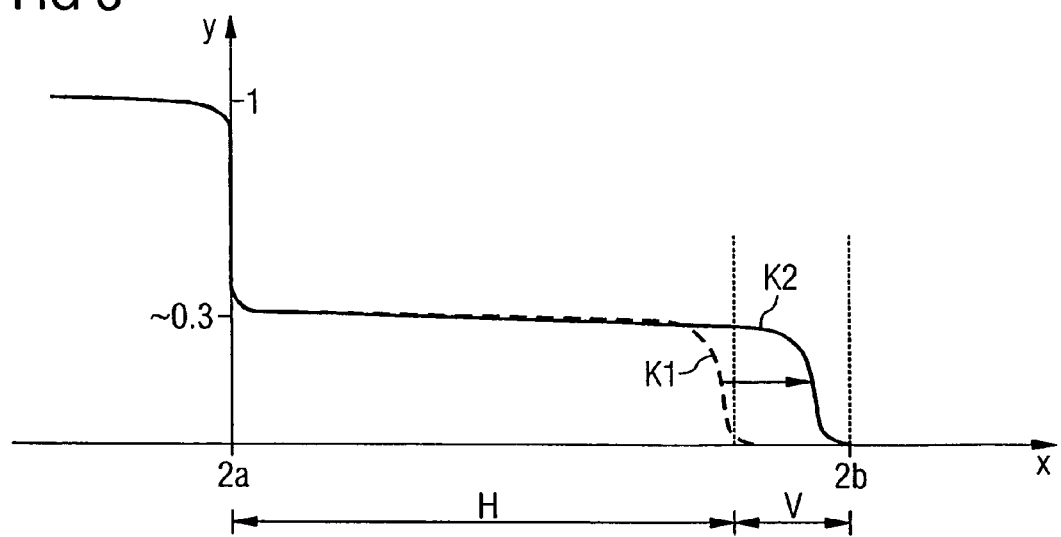
FIG. 3 shows the metal concentration or the concentration profile, respectively, of the mobile material in the chalcogenide layer during the manufacturing of a CBRAM memory cell during and after an overdoping process according to a preferred embodiment of the present invention.

FIG. 1 shows schematically and by way of example the structure of a resistively switching memory cell 1 and a central control device 5 connected thereto.

On an appropriate memory device or memory chip, respectively, a plurality of further memory cells that are of a structure similar or identical to the memory cell 1 illustrated in FIG. 1 may be arranged, e.g. in an appropriate memory cell field positioned side by side in a plurality of rows or columns. In the following, the basic functioning of a resistively switching memory cell is illustrated by way of example.

The memory cells 1 may be any kind of resistively switching memory cells, e.g. Phase Change Memory Cells or CBRAM memory cells (CB=Conductive Bridging). Controlled by a central control device 5 provided on the memory device, specific writing or deleting processes may be performed in the memory cells 1 of the memory device.

As results from FIG. 1, each of the above-mentioned memory cells 1 comprises two appropriate metal electrodes 2a, 2b, i.e. an anode and a cathode. As a material for the electrodes 2a, 2b, a metal such as tungsten, or a metal alloy such as TiN, TiSiN, TiAlN, TaSiN, TiW, etc., or some other suitable electrode material may be used.

A layer 3 of electrochemically active material is positioned between the electrodes 2a, 2b. The electrochemically active material consists of a chalcogenide compound, in particular a GeSe, GeS, AgSe, CuS compound, forming a chalcogenide matrix. In the chalcogenide matrix, mobile material such as alkali ions or metal ions, in particular of Ag or Cu, may move or be diffused into, respectively.

The active material layer 3 that is at least partially doped with mobile material may be placed in a more or less conductive state by appropriate switching processes that are, for instance, controlled by the central control device 5, in particular by applying appropriate current or voltage pulses of particular intensity and duration, wherein e.g. the more conductive state corresponds to a stored, logic "One" and the less conductive state to a stored, logic "Zero", or vice versa.

The chalcogenide compound material may also be placed in a relatively weakly conductive or a relatively strongly conductive state by appropriate switching processes that are, for instance, controlled by the central control device 5, in particular by current or voltage pulses of particular intensity and duration, wherein e.g. the relatively strongly conductive state corresponds to a stored, logic "One" and the relatively weakly conductive state to a stored, logic "Zero", or vice versa.

In order to achieve, with the memory cell 1, a change from a relatively weakly conductive state of the active material to a relatively strongly conductive state, an appropriate current pulse of appropriate intensity and duration may be applied at the electrodes 2a, 2b, e.g. controlled by the central control device 5, the current pulse effecting, due to the relatively high resistance of the active material layer 3, that electroconductive bridges are formed between the electrodes, the bridges having a lower ohmic resistance.

FIG. 2 shows a diagram for illustrating the metal concentration in the chalcogenide layer during the manufacturing of a CBRAM memory cell after a doping process according to a preferred embodiment of the present invention. The X-axis of the diagram indicates the distance between the electrodes 2a and 2b between which the electrochemically active material or the chalcogenide matrix, respectively, of the CBRAM memory cell is positioned. The Y-axis of the diagram indicates the concentration of the mobile material or of the metal ions, respectively, in the chalcogenide matrix. FIG. 2 illustrates the schematic doping profile or the concentration profile K1, respectively, of the mobile metal after the conditioning process that has, for instance, been performed by means of photo diffusion.

FIG. 2 reveals that, after the doping process according to the invention, in a preferred embodiment a doped or highly doped region H has been formed in the chalcogenide material, which, starting out from the first electrode 2a, extends into the chalcogenide matrix. Since the penetration depth of the metal ions does not reach to the second electrode 2b, an undoped region U remains between the doped or highly doped region H and the second electrode 2, the undoped region extending few nanometers to the second electrode 2b.

Thus, after the doping process according to the invention, in a preferred embodiment a doping profile K1 of the metal ions in the chalcogenide matrix has been produced, which extends via a doped or highly doped region H with an intensity of approx. 30% over a majority of the chalcogenide matrix, while an undoped region U remains between the doped or highly doped region H and the second electrode 2b. This way, the limiting area between highly doped chalcogenide and undoped chalcogenide lies distinctly before the limiting area between the chalcogenide material and the second electrode 2b.

FIG. 3 shows a diagram for illustrating the metal concentration or the concentration profile, respectively, of the mobile material in the chalcogenide layer during the manufacturing of a CBRAM memory cell during and after an overdoping process according to a preferred embodiment of the present invention. Like in FIG. 2, the X-axis of the diagram indicates the distance between the electrodes 2a and 2b between which the electrochemically active material or the chalcogenide matrix, respectively, of the CBRAM memory cell is positioned, while the Y-axis of the diagram indicates the concentration of the mobile material or the metal ions, respectively, in the chalcogenide matrix.

FIG. 3 illustrates both the schematic doping profile or concentration profile K1, respectively, of the mobile metal after the conditioning process—in dashed line—and the schematic doping profile or concentration profile K2, respectively, of the mobile metal after the overdoping process—in continuous line. The overdoping process may, for instance, be performed by means of prolonged photo diffusion.

FIG. 3 reveals that, by the overdoping process according to the invention, in a preferred embodiment the doped or highly doped region H in the chalcogenide material is extended further into the previously undoped region V until the doped or highly doped region H extends nearly through the entire chalcogenide matrix almost up to the second electrode 2b.

Thus, after the overdoping process according to the invention, in a preferred embodiment a doping profile K2 of the metal ions in the chalcogenide matrix has been produced, which extends via a doped or highly doped region H with an intensity of approx. 30% nearly over the entire chalcogenide matrix from the first electrode 2a almost up to the second electrode 2b. This way, the limiting area between highly doped chalcogenide and undoped chalcogenide lies close to the limiting area between the chalcogenide material and the second electrode 2b.

After this overdoping process, the chalcogenide material is over-saturated too strongly for the operation of a CBRAM memory cell since the limiting area between highly doped chalcogenide and undoped chalcogenide has migrated too far into the chalcogenide material. Thus, no optimal operation or no operation at all of the CBRAM memory cell as a reversibly switching element is possible in this state of doping.

Figure 4:
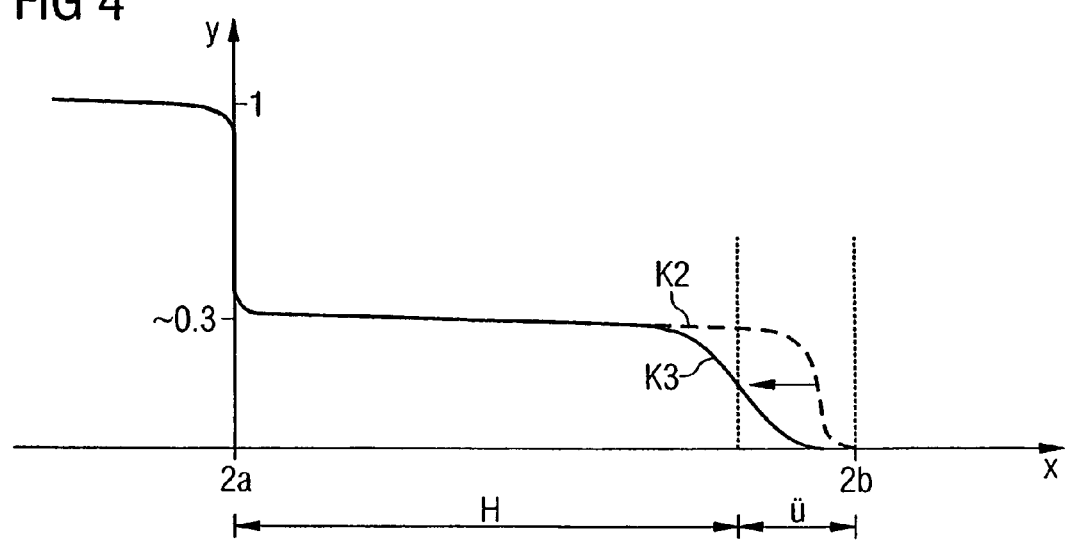
FIG. 4 shows the metal concentration or the concentration profile, respectively, of the mobile material in the chalcogenide layer during the manufacturing of a CBRAM memory cell during and after a retraction process according to a preferred embodiment of the present invention.

FIG. 4 shows a diagram for illustrating the metal concentration or the concentration profile, respectively, of the mobile material in the chalcogenide layer during the manufacturing of a CBRAM memory cell during and after a retraction process according to a preferred embodiment of the present invention. Like in FIGS. 2 and 3, the X-axis of the diagram indicates the distance between the electrodes 2a and 2b between which the electrochemically active material or the chalcogenide matrix, respectively, of the CBRAM memory cell is positioned, while the Y-axis of the diagram indicates the concentration of the mobile material or the metal ions, respectively, in the chalcogenide matrix.

FIG. 4 illustrates both the schematic doping profile or concentration profile K2, respectively, of the mobile metal after the overdoping process—in dashed line—and the schematic doping profile or concentration profile K3, respectively, of the mobile metal after the retraction process according to the invention—in continuous line. The retraction process may, for instance, be performed by applying charges of appropriate polarity to the electrodes 2a and 2b.

A comparison of the schematic doping profile K2 of the mobile metal after the overdoping process—illustrated in dashed line—with the schematic doping profile K3 of the mobile metal after the retraction process—illustrated in continuous line—reveals that the doped or highly doped region H is partially retracted from the chalcogenide material by means of the retraction process. By the retraction of the doping edge from the second electrode, a doped or highly doped region H remains in the chalcogenide layer after the retraction process, which extends from the first electrode 2a over a part of the chalcogenide matrix.

Now, an overdoped region Ü follows the doped or highly doped region H which, after the retraction, no longer extends up to the second electrode 2b since the concentration course has been optimized retrogradely by the retraction process. This way, the chalcogenide material is conditioned correctly and better for the operation of a CBRAM memory cell than after the photo diffusion process. In this state of doping, an optimal operation of the CBRAM memory cell as a reversibly switching element is possible.

What is claimed is:

1. A method for manufacturing a resistively switching memory cell, comprising a first electrode and a second electrode with an active material positioned therebetween, the active material being adapted to be placed in a substantially electroconductive state by means of electrochemical switching processes, comprising:
   doping the active material in a doping process by diffusing a mobile material into the active material from the first electrode in a direction to the second electrode to build a doped region; and
   performing a retraction process by at least partial retraction of the mobile material diffused into the active material from a region close to the second electrode to generate or modify a doping profile between the doped region and an undoped region, wherein performing the retraction process comprises applying an electric charge to the electrodes by contact with a high frequency inert gas plasma.

2. The method according to claim 1, wherein the doping process further comprises:
   doping the active material by diffusing a mobile material into the active material in a doping process; and
   overdoping the active material by diffusing the mobile material into the active material in an overdoping process exceeding the prior doping, such that, in the active material, a doped region is formed from the first electrode up to the second electrode.

3. The method according to claim 1, wherein at least one of the doping process and the overdoping process is performed such that the mobile material is diffused into the active material from the first electrode up to the second electrode.

4. The method according to claim 1, wherein the active material comprises a chalcogenide compound, consisting of a GeSe, GeS, AgSe, or a CuS compound, and wherein the mobile material comprises alkali ions or metal ions, respectively, consisting of Ag, Zn, or Cu.

5. The method according to claim 1, wherein the mobile material diffused into the active material diffuses back at least partially from the active material during the retraction process.

6. The method according to claim 1, wherein a doped or overdoped phase and an undoped phase are formed in the active material.

7. The method according to claim 6, wherein a particular penetration depth of the mobile material into the active material, in a region between the doped or overdoped phase and the undoped phase in the active material, is achieved.

8. The method according to claim 6, wherein a particular concentration profile of the mobile material is formed in the active material, in a region between the doped or overdoped phase and the undoped phase in the active material.

9. The method according to claim 1, wherein the mobile material is diffused into the active material or diffused back, respectively, with an electric charge of appropriate polarity that is applied from outside preferably via the electrodes.

10. The method according to claim 1, wherein the active material is preconditioned preferably by means of photo diffusion.

11. The method according to claim 1, wherein self-adjusting processes are used in which different lithography levels do not comprise any misadjustment with respect to one another.

12. A method for manufacturing a resistively switching memory cell, comprising a first electrode and a second electrode with an active material positioned therebetween, the active material being adapted to be placed in a substantially electroconductive state by means of electrochemical switching processes, comprising:
   doping the active material in a doping process by diffusing a mobile material into the active material from the first electrode in a direction to the second electrode to build a doped region; and
   performing a retraction process by at least partial retraction of the mobile material diffused into the active material from a region close to the second electrode to generate or modify a doping profile between the doped region and an undoped region, wherein performing the retraction process comprises applying an electric charge to the electrodes by inert gas ion beams.

13. The method according to claim 12, wherein the doping process further comprises:
   doping the active material by diffusing a mobile material into the active material in a doping process; and overdoping the active material by diffusing the mobile material into the active material in an overdoping process exceeding the prior doping, such that, in the active material, a doped region is formed from the first electrode up to the second electrode.

14. The method according to claim 12, wherein at least one of the doping process and the overdoping process is performed such that the mobile material is diffused into the active material from the first electrode up to the second electrode.

15. The method according to claim 12, wherein the active material comprises a chalcogenide compound, consisting of a GeSe, GeS, AgSe, or a CuS compound, and wherein the mobile material comprises alkali ions or metal ions, respectively, consisting of Ag, Zn, or Cu.

16. The method according to claim 12, wherein the mobile material diffused into the active material diffuses back at least partially from the active material during the retraction process.

17. The method according to claim 12, wherein a doped or overdoped phase and an undoped phase are formed in the active material.

18. The method according to claim 17, wherein a particular penetration depth of the mobile material into the active material, in a region between the doped or overdoped phase and the undoped phase in the active material, is achieved.

19. The method according to claim 17, wherein a particular concentration profile of the mobile material is formed in the active material, in a region between the doped or overdoped phase and the undoped phase in the active material.

20. The method according to claim 12, wherein the mobile material is diffused into the active material or diffused back, respectively, with an electric charge of appropriate polarity that is applied from outside preferably via the electrodes.

21. The method according to claim 12, wherein the active material is preconditioned preferably by means of photo diffusion.

22. The method according to claim 12, wherein self-adjusting processes are used in which different lithography levels do not comprise any misadjustment with respect to one another.

* * * * *